US011929250B2

United States Patent
Sato et al.

(10) Patent No.: US 11,929,250 B2
(45) Date of Patent: Mar. 12, 2024

(54) SUBSTRATE PROCESSING APPARATUS, SUBSTRATE PROCESSING METHOD AND A SEMICONDUCTOR DEVICE MANUFACTURING METHOD

(71) Applicant: KIOXIA CORPORATION, Tokyo (JP)

(72) Inventors: Katsuhiro Sato, Yokkaichi Mie (JP); Hiroshi Fujita, Mie Mie (JP); Tatsuhiko Koide, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/684,206

(22) Filed: Mar. 1, 2022

(65) Prior Publication Data

US 2023/0089765 A1 Mar. 23, 2023

(30) Foreign Application Priority Data

Sep. 17, 2021 (JP) ................. 2021-151776

(51) Int. Cl.
*H01L 21/02* (2006.01)
*H01L 21/67* (2006.01)
*H01L 21/673* (2006.01)
*H10B 41/00* (2023.01)
*H10B 43/00* (2023.01)

(52) U.S. Cl.
CPC .... *H01L 21/0206* (2013.01); *H01L 21/02068* (2013.01); *H01L 21/67034* (2013.01); *H01L 21/67057* (2013.01); *H01L 21/673* (2013.01); *H01L 21/67313* (2013.01); *H10B 41/00* (2023.02); *H10B 43/00* (2023.02)

(58) Field of Classification Search
CPC ............ H01L 21/02068; H01L 21/206; H01L 21/67034; H01L 21/67057; H01L 21/673; H01L 21/0206; H01L 21/67313; H10B 43/00; H10B 41/00
USPC ........................................... 134/61
See application file for complete search history.

(56) References Cited

U.S. PATENT DOCUMENTS

| 6,270,584 B1 * | 8/2001 | Ferrell ................. B08B 3/102 34/79 |
| 2002/0095036 A1 | 7/2002 | Kuo et al. |
| 2010/0192992 A1 | 8/2010 | Toshima et al. |
| 2014/0130367 A1 * | 5/2014 | Yonekawa ........ H01L 21/67034 34/380 |

FOREIGN PATENT DOCUMENTS

| JP | H04259222 A | 9/1992 |
| JP | 2001518704 A | 10/2001 |
| JP | 2003077877 A | 3/2003 |
| JP | 2006073573 A | 3/2006 |
| JP | 2009024025 A | 2/2009 |
| JP | 2010182817 A | 8/2010 |

* cited by examiner

Primary Examiner — Tinsae B Ayalew
(74) Attorney, Agent, or Firm — Kim & Stewart LLP

(57) ABSTRACT

According to one embodiment, a substrate processing apparatus includes a batch type cleaning unit, a holding unit, and a single-substrate type drying unit. The batch type cleaning unit simultaneously cleans a plurality of substrates in a batch process with a first liquid. The holding unit receives the cleaned substrates while still wet and then keeps a first surface of each of the substrates wet with the first liquid. The single-substrate type drying unit is configured to receive the substrates one by one from the holding unit and then dry off the substrates one by one.

24 Claims, 14 Drawing Sheets

SUBSTRATE PROCESSING APPARATUS, SUBSTRATE PROCESSING METHOD AND A SEMICONDUCTOR DEVICE MANUFACTURING METHOD

CROSS-REFERENCE TO RELATED APPLICATION

This application is based upon and claims the benefit of priority from Japanese Patent Application No. 2021-151776, filed Sep. 17, 2021, the entire contents of which are incorporated herein by reference.

FIELD

Embodiments described herein relate generally to a substrate processing apparatus and a substrate processing method related to semiconductor device manufacturing and the like.

BACKGROUND

During a manufacturing process of a semiconductor device, such as a NAND flash memory, a substrate is cleaned and dried by a substrate processing apparatus. For example, a substrate, such as a silicon wafer, after film formation has been performed on a surface will be subjected to the cleaning and drying process after the film formation process and before subsequent processes.

DETAILED DESCRIPTION

Figure 1:
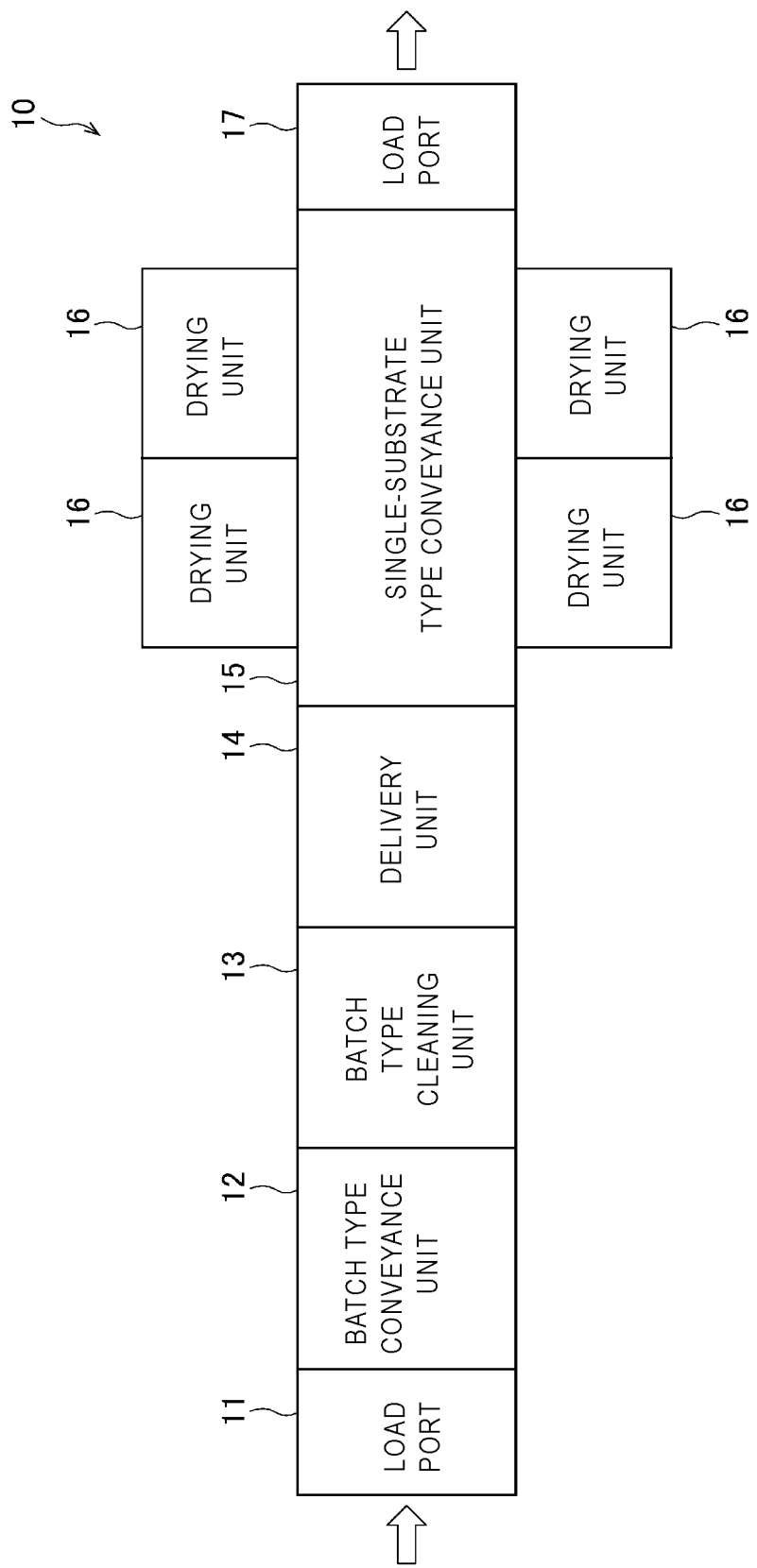
FIG. 1 is a schematic diagram showing an overall configuration of a substrate processing apparatus in a top view according to an embodiment.

Embodiments provide a substrate processing apparatus and a substrate processing method for processing a plurality of substrates in a short time and preventing defects associated with drying processes.

In general, according to one embodiment, a substrate processing apparatus includes a batch cleaning unit configured to simultaneously clean a plurality of substrates in a batch process with a first liquid. A holding unit is provided to receive the plurality of substrates from the batch cleaning unit while still wet with the first liquid and then store the plurality of substrates still wet with the first liquid. A single-substrate drying unit is configured to receive substrates one by one from the holding unit and then individually dry the substrates one by one. The holding unit includes a maintenance mechanism that keeps a first surface of each of the substrates being stored in the holding unit covered with a liquid.

Hereinafter, some example embodiments will be described with reference to the accompanying drawings. The same components, elements, and the like are denoted by the same reference numerals in the respective drawings, and redundant descriptions may be omitted.

In one example embodiment, a substrate processing apparatus 10 is used for a manufacturing process of a semiconductor memory device such as a NAND flash memory. The substrate processing apparatus 10 is an apparatus for cleaning and drying a substrate WF. The substrate WF is, for example, a disk-shaped silicon wafer and has a pattern (see, for example, FIG. 2) formed on one surface. The substrate WF to be processed by the substrate processing apparatus 10 may be a substrate other than a silicon wafer. Likewise, the substrate processing apparatus 10 may be used in a manufacturing process for an apparatus, a device, or the like other than a semiconductor memory device.

As shown in FIG. 1, the substrate processing apparatus 10 includes a load port 11, a batch type conveyance unit 12, a batch type cleaning unit 13, a delivery unit 14, a single-wafer type conveyance unit 15, drying units 16, and a load port 17.

The load port 11 receives one or more substrates WF to be processed by the substrate processing apparatus 10 from outside of the substrate processing apparatus 10. For example, a plurality of substrates WF are housed in a sealed container such as a FOUP (front-opening unified pod), and the FOUP is set in the load port 11.

The batch type conveyance unit 12 is a device that conveys the plurality of substrates WF from the load port 11 to the batch type cleaning unit 13. The substrates WF are held by the batch type conveyance unit 12 while being transferred to the batch type cleaning unit 13. In batch type conveyance unit 12 the substrates WF are spaced from each in a direction perpendicular to the main surfaces of the substrates.

The batch type cleaning unit 13 is a device that cleans the substrates WF in a batch manner, that is together in the same process. For example, the batch type cleaning unit 13 immerses the substrates WF are simultaneously immersed in a chemical liquid containing phosphoric acid for a cleaning process. Subsequently, the batch type cleaning unit 13 immerses all of the substrates WF in a rinse liquid, such as pure water, for a rinsing process. In the present embodiment, these cleaning and rinsing processes may be collectively referred to as a "cleaning process," a "cleaning step," or the like.

The delivery unit 14 is a device that delivers the substrates WF that have been cleaned in the batch type cleaning unit 13 to the single-substrate tape conveyance unit 15. The delivery unit 14 may receive the cleaned substrates WF from the batch type cleaning unit 13 and temporarily hold them with a holding unit 500 (see FIG. 12) for subsequent delivery to the single-substrate type conveyance unit 15 that takes substrates WF one by one.

The single-substrate type conveyance unit 15 is a device that conveys the substrates WF one by one from the delivery unit 14 to the individual drying units 16 and then from the drying units to load port 17 in a single-substrate manner. The single-substrate type conveyance unit 15 takes the substrates WF one by one from the holding unit 500 of the delivery unit 14 and conveys each substrate WF to a drying unit 16 for a drying process.

The drying unit 16 is a device that receives a substrate WF from the single-substrate type conveyance unit 15 and then dries the substrate WF. Each drying unit 16 in this example dries a single substrate WF at time using a method referred to as "supercritical drying." In the present embodiment, a plurality of drying units 16 are provided adjacent to the single-substrate type conveyance unit 15. In the example of FIG. 1, four drying units 16 are provided, but the number of drying units 16 is not limited thereto. In the present embodiment, the single-substrate type conveyance unit 15 and the plurality of drying units 16 together constitute a "single-substrate type drying unit" that provides the drying process for each of the substrates WF individually. The single-substrate type drying unit takes out or receives the substrates WF one by one from the holding unit 500 and dries them one by one in one of the drying units 16.

After being dried in a drying unit 16, the substrates WF are taken out from the drying unit 16 by the single-substrate type conveyance unit 15 and conveyed to the load port 17.

The load port 17 is where the processed substrates WF are removed to the outside of the substrate processing apparatus 10. For example, an empty FOUP is set in the load port 17 in advance, and the single-substrate type conveyance unit 15 sends the dried substrates WF to the FOUP one by one. Once the FOUP is filled with substrates WF, the FOUP is removed from the load port 17 to be transferred to another apparatus, device, or the like for subsequent processing steps.

The substrate processing apparatus 10 according to the present embodiment cleans the substrates WF in the batch manner but dries the substrates WF in a single-substrate manner. From the viewpoint of processing the plurality of substrates WF in the shortest possible period of time, it may generally be better to perform both the cleaning process and the drying process on the substrates WF in the batch manner. However, when the substrates WF are dried in a batch manner, a defect associated with the drying process (a drying defect) is more likely to occur.

Figure 2:
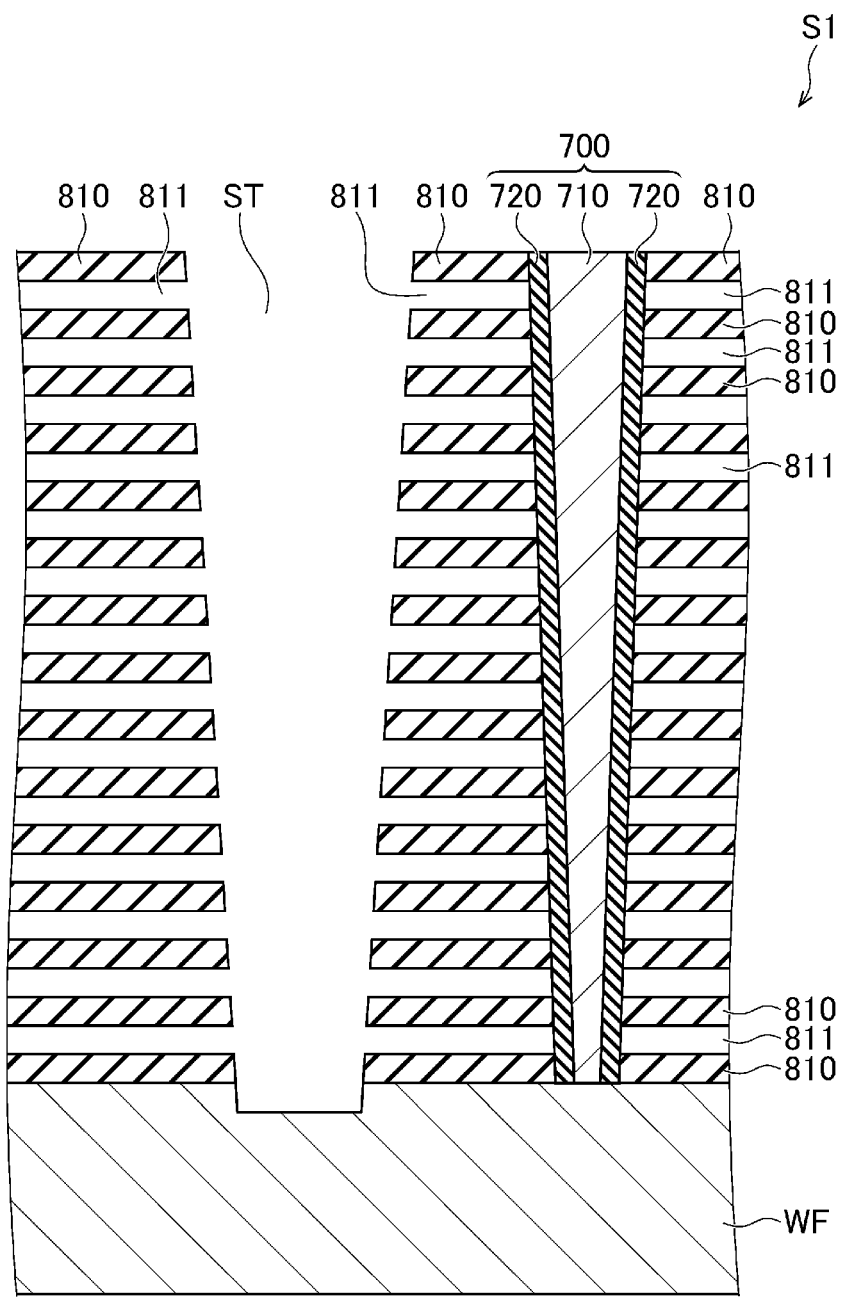
FIG. 2 depicts a defect that can be caused by a drying process.

A possible mechanism for an increase in drying defects in batch drying processes will be described. FIG. 2 schematically shows an example of a cross section of a substrate WF being processed. The substrate WF in FIG. 2 is in a state (a partially manufactured state) in which the semiconductor memory devices thereon are still being manufactured. A plurality of insulating layers 810 and a memory pillar 700 that penetrates the insulating layers 810 are formed on a surface of the substrate WF.

The memory pillar 700 has a columnar body of a substantially cylindrical shape and extends in a vertical direction. The memory pillar 700 includes a semiconductor pillar 710 and a stacked film 720. The semiconductor pillar 710 is formed of, for example, polysilicon, and is provided in a central portion of the memory pillar 700. An insulator may be provided inside the semiconductor pillar 710 as an insulating core structure in some examples.

The stacked film 720 covers the side surface of the semiconductor pillar 710 over its entire periphery and is formed by stacking a plurality of films. The plurality of films include a block insulating film, a charge trap film, a tunnel film, and the like (not separately shown).

Each of the insulating layers 810 is, for example, a film formed of an insulator, such as silicon oxide, and a plurality of insulating layers 810 are arranged in the vertical direction at intervals from each other. Gaps 811 between the insulating layers 810 adjacent to each other are portions in which a conductor material, such as tungsten, will be embedded during a subsequent manufacturing step. Each of the conductors eventually formed in the gaps is used as a word line for applying a voltage to a gate of a memory cell or the like. A portion of the memory pillar 700 intersecting with one of these conductors functions as a memory cell.

The gaps 811 are formed by alternately stacking the plurality of insulating layers 810 and sacrificial layers on one another, then forming a slit ST as shown in FIG. 2 in the stacked body, and then removing the sacrificial layers by wet etching through the slit ST. As the sacrificial layers, for example, silicon nitride is used.

In the present embodiment, the substrate WF in the state as illustrated in FIG. 2, that is, after the sacrificial layers have been removed by the wet etching but before the conductors are embedded in the gaps 811, corresponds to the substrates WF to be processed by the substrate processing apparatus 10. In other examples, the substrates WF to be processed by the substrate processing apparatus 10 may be in a state different from that shown in FIG. 2. The surface of the substrate WF on which the insulating layers 810, the memory pillar 700, etc. are formed may be referred to as a "surface S1" or a "first surface."

Figure 3A:
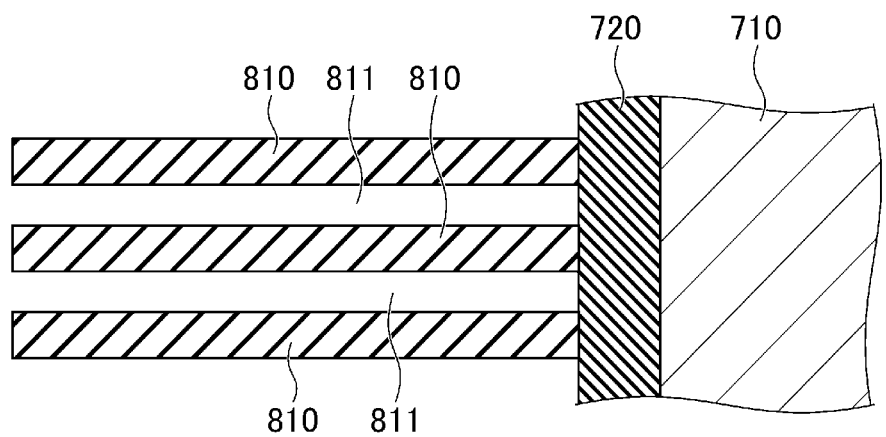
FIGS. 3A and 3B depict examples of a drying defect.

As shown in an enlarged view in FIG. 3A, when the processing by the substrate processing apparatus 10 is performed, the plurality of insulating layers 810 are already provided on the substrates WF with the gaps 811 formed therebetween. Therefore, in the wet cleaning process of such a substrate WF in the batch type cleaning unit 13, the liquid used for cleaning (for example, a pure water rinse) enters into and fills the gaps 811.

Figure 3B:
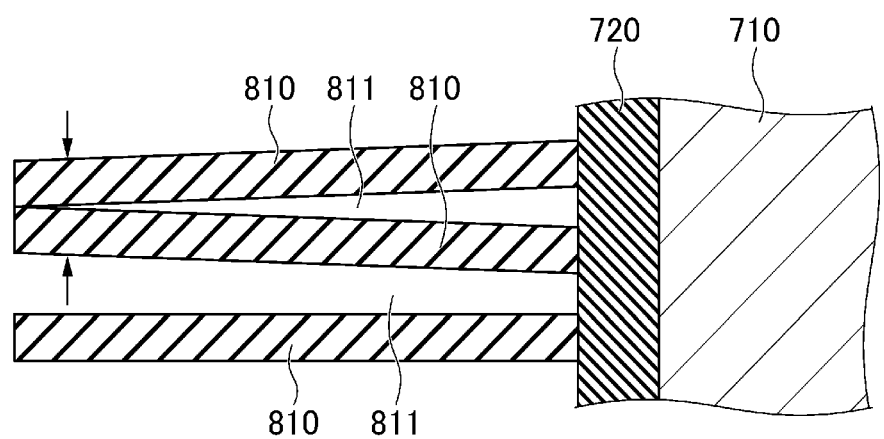

From this filled state, when the liquid begins to gradually decreases volume due to, for example, evaporation, surface tension may begin to apply a force to the insulating layers 810. As a result, as shown in FIG. 3B, there is a possibility that part of an insulating layer 810 deforms and bends to come into contact with an adjacent insulating layer 810. Such a pattern collapse hinders a normal fabrication of the semiconductor memory device, which is not preferable. If a plurality of substrates WF are dried simultaneously, that is, the drying process is performed in a batch manner, the rate of decrease in the liquid within the patterns/structures of each substrate WF will typically be lower than that when the substrates WF are individually dried in the single-substrate manner. Thus, the collapse of the pattern in a batch drying process is more likely to occur than in the single-substrate drying process.

As shown in FIG. 2, as the slit ST approaches the substrate WF in the vertical direction, the width of the slit ST tends to gradually decrease in the horizontal direction. Therefore, the closer a gap 811 is to the substrate WF, the greater the length of the gap 811 in a left and right direction (the horizontal direction) will be, and thus the collapse of the pattern (such as shown in FIG. 3B) is more likely to occur.

As the number of the stacked insulating layers 810 increases, the length in the left and right direction of the gaps 811 nearer the substrate WF becomes even longer, and the collapse of the pattern is more likely to occur. If the pattern formed on the substrate WF is further miniaturized or stacked at a greater density, it will generally be more difficult to dry the substrate WF in the batch manner.

To prevent or mitigate such issues associated with the drying process, the substrate processing apparatus 10 according to the present embodiment dries the plurality of substrates WF in the single-substrate manner whereas, to provide shorter overall processing times, it cleans the plurality of substrates WF in a batch manner.

Figure 4:
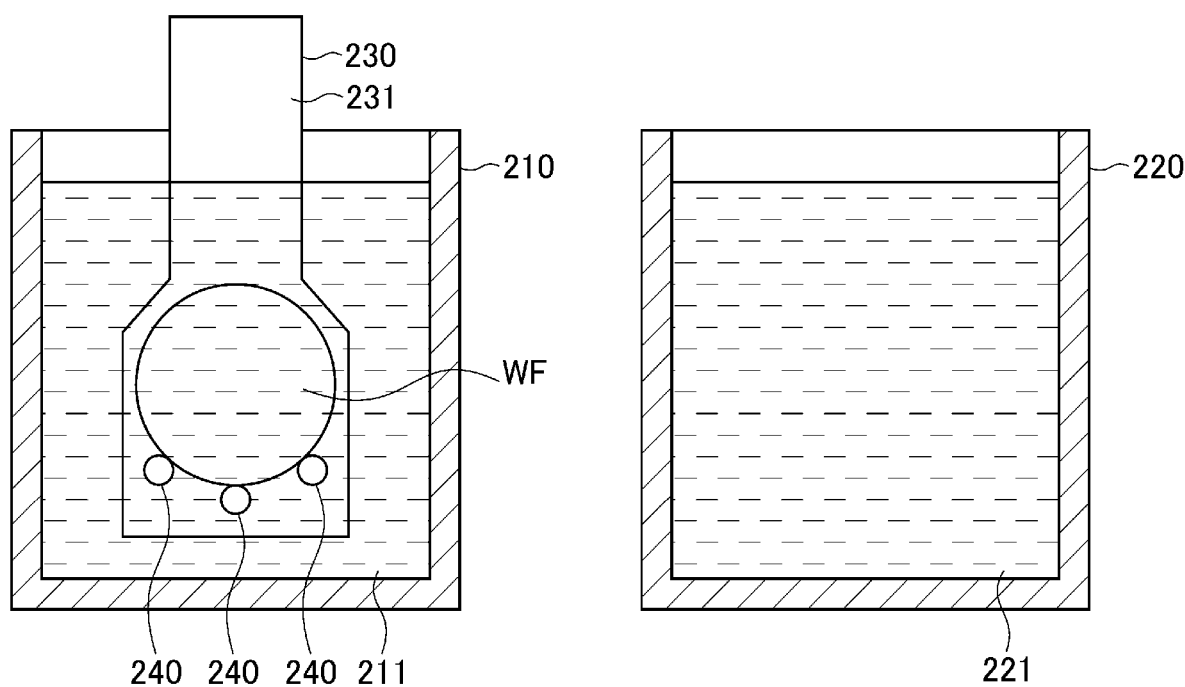
FIG. 4 depicts a batch type cleaning unit according to an embodiment.

In the present embodiment, the batch type cleaning unit 13 includes a cleaning tank 210 and a rinsing bath 220 as shown in FIG. 4. The cleaning tank 210 holds therein, for example, a chemical liquid 211 comprising phosphoric acid (e.g., an aqueous phosphoric acid solution). The rinsing bath 220 contains, for example, a rinse liquid 221, such as ultrapure water.

The plurality of substrates WF conveyed to the batch type cleaning unit 13 by the batch type conveyance unit 12 are first conveyed to the inside of the cleaning tank 210 and immersed in the chemical liquid 211 while being held by a lifter 230.

Figure 5:
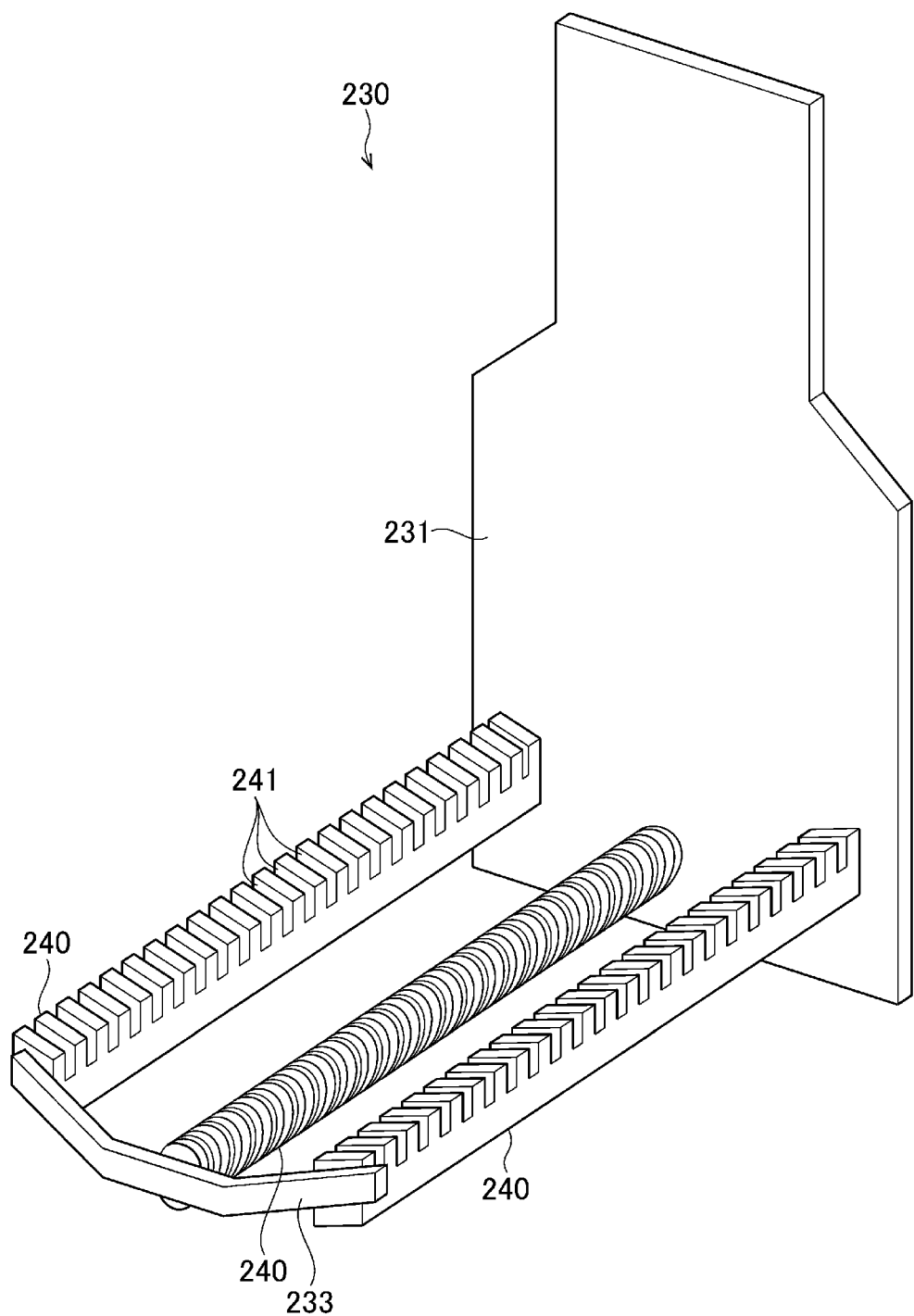
FIG. 5 depicts a lifter of a batch type cleaning unit according to an embodiment.

As shown in FIG. 5, the lifter 230 includes a plate-shaped body 231 and a plurality of rod-shaped bodies 240. The plate-shaped body 231 is a substantially flat plate-shaped member and is provided with the normal direction thereof oriented in a horizontal direction. The plate-shaped body 231 is movable in the vertical direction and/or the horizontal direction by the force from a driving device.

Each of the rod-shaped bodies 240 is a rod-shaped member that extends in the normal direction from the plate-shaped body 231. A total of three rod-shaped bodies 240 are provided in the present embodiment, and an end portion on one side of each rod-shaped body 240 is joined to the plate-shaped body 231. An end portion on the other side of each rod-shaped body 240 is joined to a reinforcing plate 233. As shown in FIG. 4, the rod-shaped bodies 240 support the plurality of substrates WF from below. Each rod-shaped body 240 is formed with a plurality of grooves 241 arranged in the longitudinal direction of the rod-shaped body 240. The substrates WF are held in the respective grooves 241.

As shown in FIG. 4, the substrates WF are supported from below by the three rod-shaped bodies 240 in a state of being erected in parallel to the plate-shaped body 231. The substrates WF are aligned in the longitudinal direction of the rod-shaped bodies 240 (FIG. 5).

The substrates WF are immersed in the chemical liquid 211 while being supported by the lifter 230 and are thus cleaned simultaneously or substantially so. For example, a silicon nitride film initially on the substrates WF is removed by the phosphoric acid in the cleaning tank 210. The cleaning of the substrates WF in the cleaning tank 210 may be performed with other chemicals for other purposes.

When the cleaning of the substrates WF in the cleaning tank 210 is completed, the lifter 230 moves upward to lift the substrates WF out from the chemical liquid 211. Thereafter, the lifter 230 moves to a right side of FIG. 4, reaches a point above the rinsing bath 220, and then descends into the rinsing bath 220. The substrates WF are immersed in the rinse liquid 221 of the rinsing bath 220 while still being supported by the lifter 230.

By immersing the substrates WF in the rinse liquid 221, the chemical liquid 211 or residues or the like adhering to the surface S1 of the substrates WF is removed by the rinse liquid 221. However, the rinse liquid 221 also replaces (displaces) the chemical liquid 211 in the gaps 811. As the rinse liquid 221, a liquid other than ultrapure water may be used in other examples. In some examples, substrates WF after being removed from the chemical liquid 211 (cleaning tank 210) may be immersed in an alkaline cleaning tank and washed before being immersed in the rinse liquid 221 (rinsing bath 220).

When the rinsing process of the substrates WF in the rinsing bath 220 is completed, the lifter 230 moves upward to lift the substrates WF out from the rinse liquid 221. Accordingly, the cleaning (including the rinsing) of the substrates WF by the batch type cleaning unit 13 is completed. However, at this time, each substrate WF is still wet with the rinse liquid 221.

Figure 6:
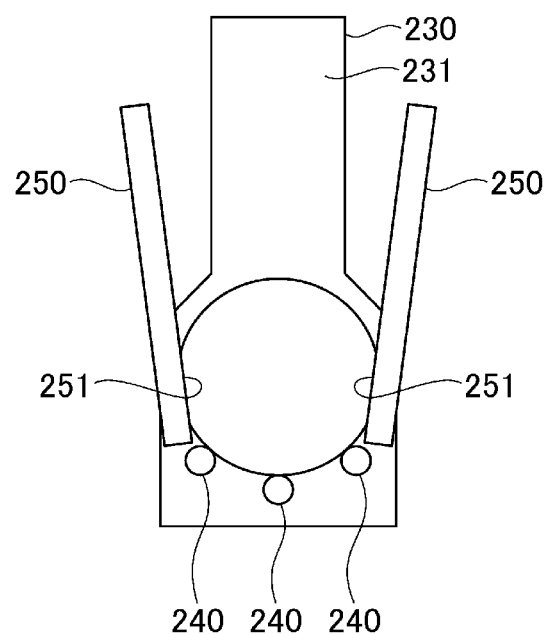
FIG. 6 depicts aspects of a substrate conveyance mechanism according to an embodiment.
Figure 7:
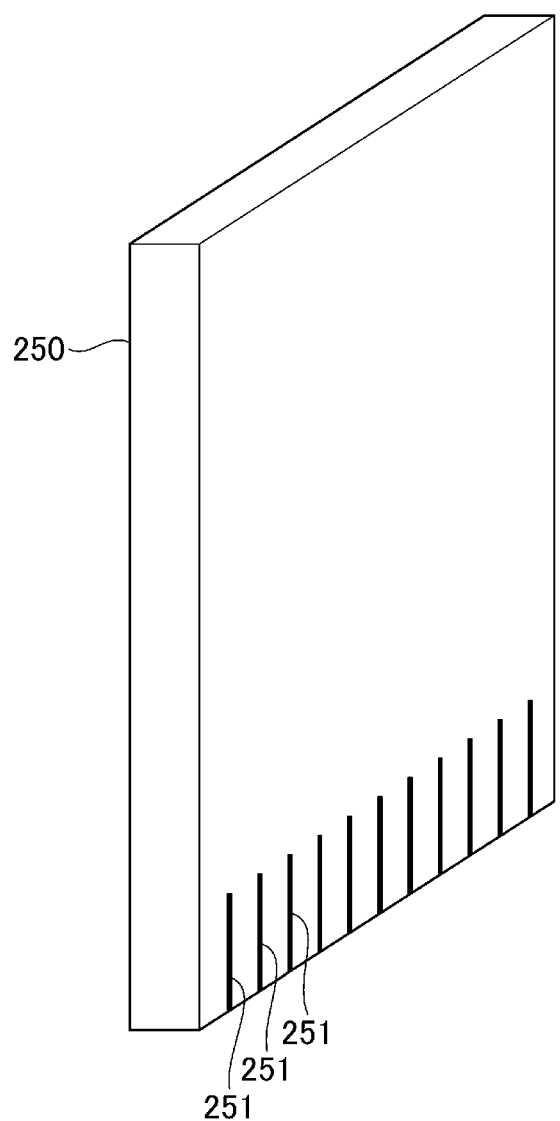
FIG. 7 depicts aspects of a substrate conveyance mechanism according to an embodiment.

In the present embodiment, the delivery unit 14 of the substrate processing apparatus 10 is provided with a plurality of conveyance mechanisms that convey the substrates WF that have gone through the batch cleaning process. A conveyance member 250 shown in FIGS. 6 and 7 is one of the conveyance mechanisms. The conveyance member 250 takes the substrates WF from the lifter 230. While the conveyance mechanisms are provided as part of the delivery unit 14 in this example, it is also possible for some or all of the conveyance mechanisms to enter into the batch type cleaning unit 13 and operate to move substrates WF therefrom.

Each conveyance member 250 is a substantially flat plate-shaped member, and a total of two conveyance members 250 are provided in the present embodiment. As shown in FIG. 6, a pair of conveyance members 250 sandwich the substrates WF that are being supported by the lifter 230 from both left and right sides. As shown in FIG. 7, a plurality of grooves 251 extending in the vertical direction are formed in each of the conveyance members 250 on a substrate WF side. The direction in which the grooves 251 are arranged is the same as the direction in which the substrates WF are arranged in the lifter 230. The interval between the adjacent grooves 251 is the same as the interval between the substrates WF in the lifter 230.

As shown in FIG. 6, the pair of conveyance members 250 are inclined such that lower end portions thereof are closer to each other and sandwich the substrates WF from both left and right sides. A part of each substrate WF enters the corresponding grooves 251 of the left and right conveyance members 250 and is thus supported by the conveyance members 250 from below. While supporting substrates WF in such a way, the pair of conveyance members 250 move upwards so that the substrates WF are taken out from the lifter 230. Thereafter, the substrates WF are delivered from the conveyance members 250 to a rotation mechanism 300 (see FIG. 8). The rotation mechanism 300 is, like the conveyance members 250, a part of the conveyance mechanisms provided in the delivery unit 14.

Figure 8:
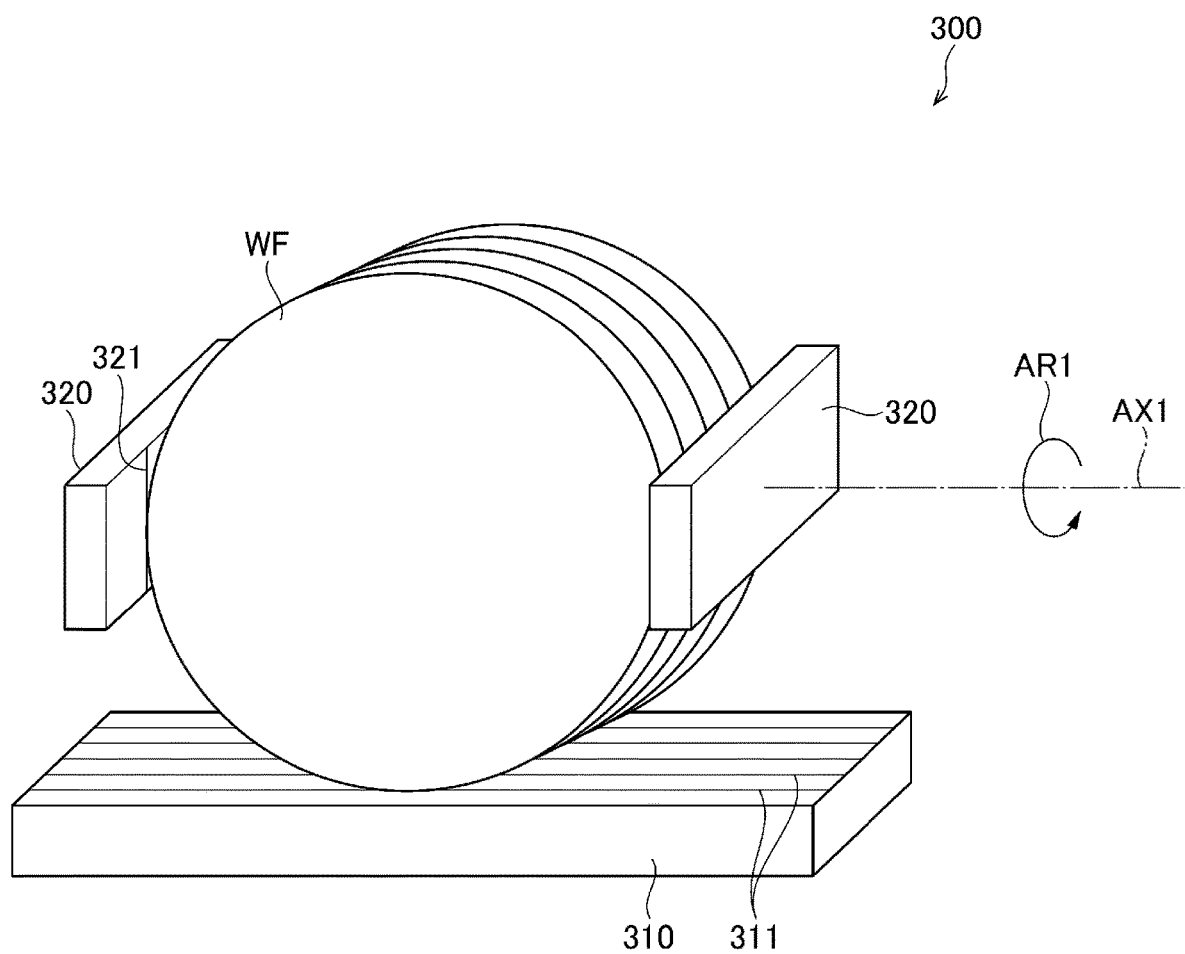
FIG. 8 depicts aspects of a substrate conveyance mechanism according to an embodiment.

As shown in FIG. 8, the rotation mechanism 300 includes one first holding member 310 and two second holding members 320. The first and second holding members 310 and 320 are plate-shaped members and function to support each of the substrates WF at three positions. A plurality of grooves 311 into which the substrates WF enter are formed in the first holding member 310. A plurality of grooves 321 into which the substrates WF enter are formed in the second holding members 320 as well. In FIG. 8, the state immediately after the substrates WF have been delivered from the conveyance members 250 to the rotation mechanism 300 is depicted. In this state, the first holding member 310 supports the substrates WF from a lower side, and the pair of second holding members 320 support the substrates WF by sandwiching them from lateral sides. In some examples, the pair of conveyance members 250 shown in FIG. 6 may also operate as the pair of second holding members 320.

Figure 9:
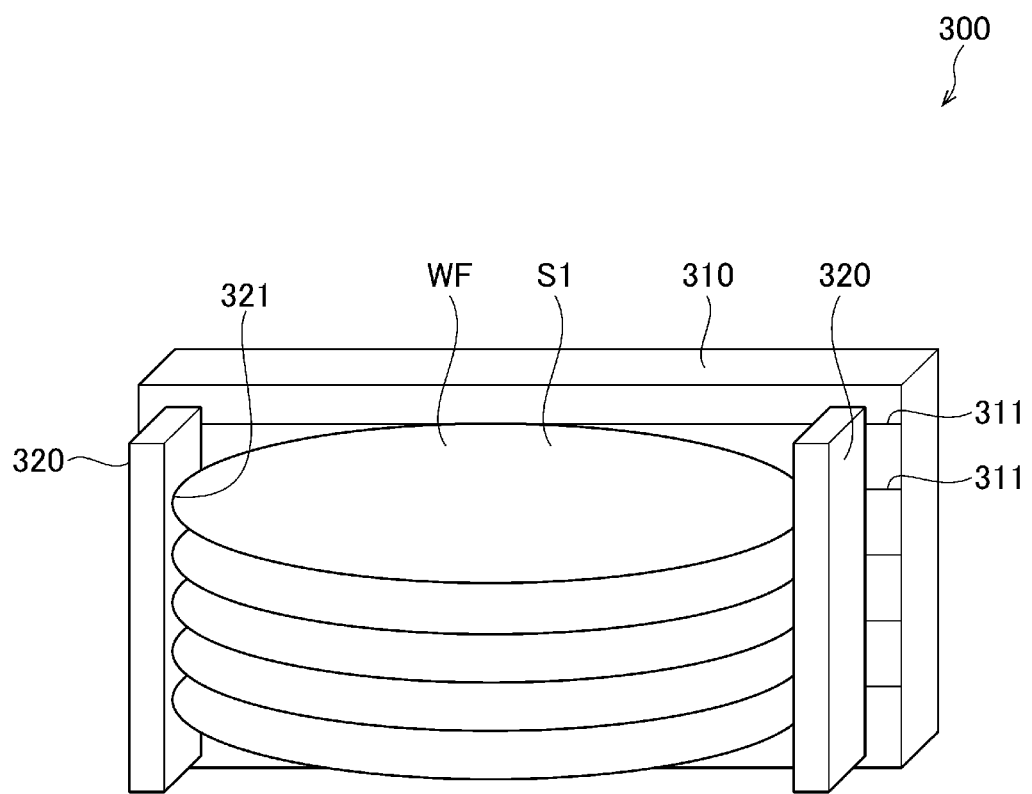
FIG. 9 depicts aspects of a substrate conveyance mechanism according to an embodiment.

The rotation mechanism 300 is configured such that the first holding member 310 and the second holding members 320 can rotate by 90 degrees in a direction of the arrow AR1 around the rotation axis AX1 shown in FIG. 8. After such rotation is performed, as shown in FIG. 9, the plurality of substrates WF are arranged at equal intervals in the vertical direction with the normal direction of main surfaces thereof aligned with the vertical direction. At this time, the surface S1 of each substrate WF is facing upwards.

Since each of the substrates WF was immersed in the rinse liquid 221 before reaching the state shown in FIG. 9, the surface S1 will still be wet with the rinse liquid 221. However, since the surface S1 is now horizontal and facing upwards, the rinse liquid 221 on the surface S1 will substantially remain on the surface S1 without falling off or shedding due to gravity. In the present embodiment, each of the substrates WF pulled up from the rinse liquid 221 is rotated to make its surface S1 horizontal soon after the rinsing process such that the entire or substantially entire surface S1 will remain wet with the rinse liquid 221. Accordingly, drying of the rinse liquid 221 on the surface S1 and collapse of the pattern, such as shown in FIG. 3B, is prevented at this time.

Figure 10:
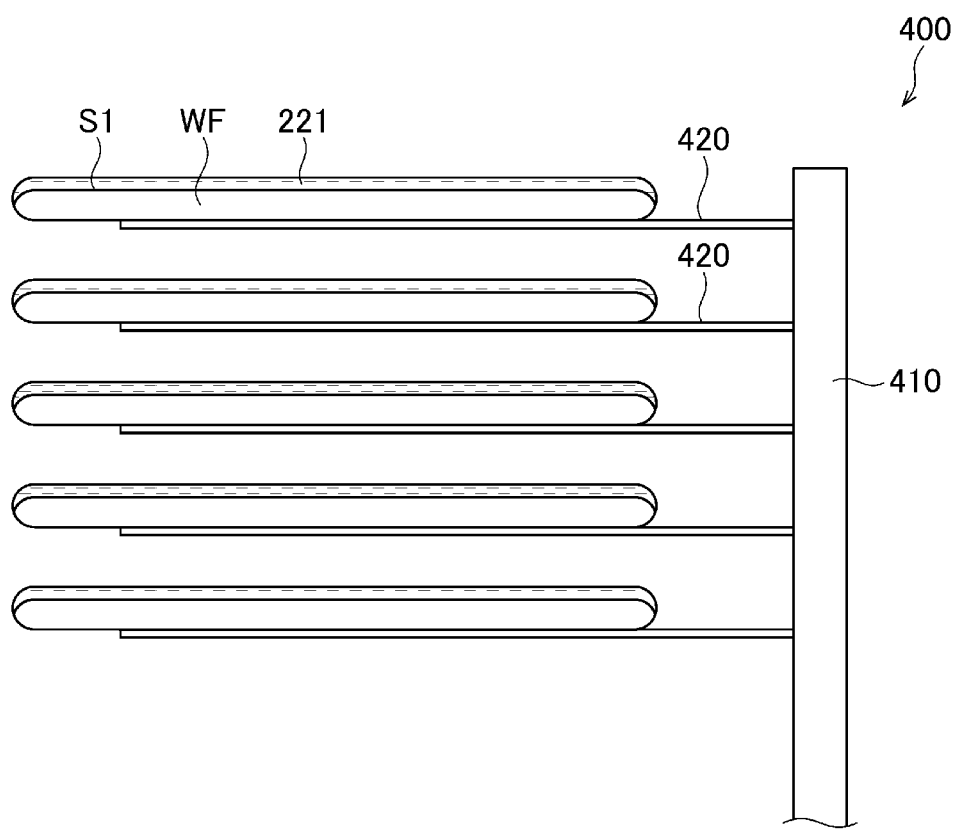
FIG. 10 depicts aspects of a substrate conveyance mechanism according to an embodiment.
Figure 11:
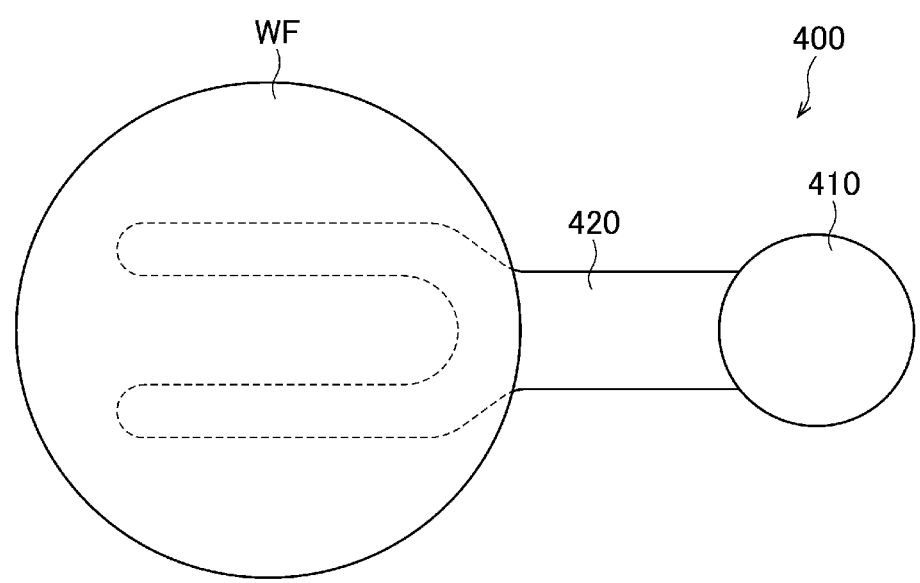
FIG. 11 depicts aspects of a substrate conveyance mechanism according to an embodiment.

Subsequently, the plurality of substrates WF are taken out from the rotation mechanism 300 by a conveyance member 400 shown in FIGS. 10 and 11. The conveyance member 400, the conveyance members 250, and the rotation mechanism 300 are, in this example, considered parts of the conveyance mechanisms provided in the delivery unit 14. FIG. 10 shows a side view of the conveyance member 400 holding the plurality of substrates WF. FIG. 11 shows a top view of the conveyance member 400 holding the plurality of substrates WF.

The conveyance member 400 includes a vertical shaft 410 and horizontal arms 420. The vertical shaft 410 is a generally rod-shaped member. The vertical shaft 410 can be moved up and down by a driving mechanism. Each of the horizontal arms 420 is a plate-shaped member connected to the vertical shaft 410, and the horizontal arms 420 are arranged along the longitudinal direction of the vertical shaft 410. The interval between the adjacent horizontal arms 420 is the same as the interval between the adjacent substrates WF when being held by the rotation mechanism 300.

As shown in FIG. 10, the plurality of substrates WF after being taken out from the rotation mechanism 300 by the conveyance member 400 have the surfaces S1 facing upward, as was the case for the substrates WF while being held by the rotation mechanism 300. The entire or substantially entire surface S1 of the substrate WF is still wet with the rinse liquid 221 in FIG. 10. The substrates WF are conveyed to the inside of the holding unit 500 of the delivery unit 14 shown in FIG. 12 by the conveyance member 400 while the surfaces S1 thereof are kept wet with the rinse liquid 221.

The holding unit 500 is a substantially rectangular parallelepiped container provided as part of the delivery unit 14. The holding unit 500 includes a top plate 511, a bottom plate 512, side plates 513, an inlet shutter 514, and an outlet shutter 515.

The top plate 511 is a substantially rectangular plate-shaped shaped member disposed along a horizontal plane and is placed in an upper portion of the holding unit 500. The bottom plate 512 is a substantially rectangular plate-shaped member disposed along the horizontal plane and is placed in a lower portion of the holding unit 500. The side plates 513 are substantially rectangular plate-shaped members that connect the top plate 511 and the bottom plate 512 and are disposed on both a far side and a near side of the paper surface of FIG. 12.

Figure 12:
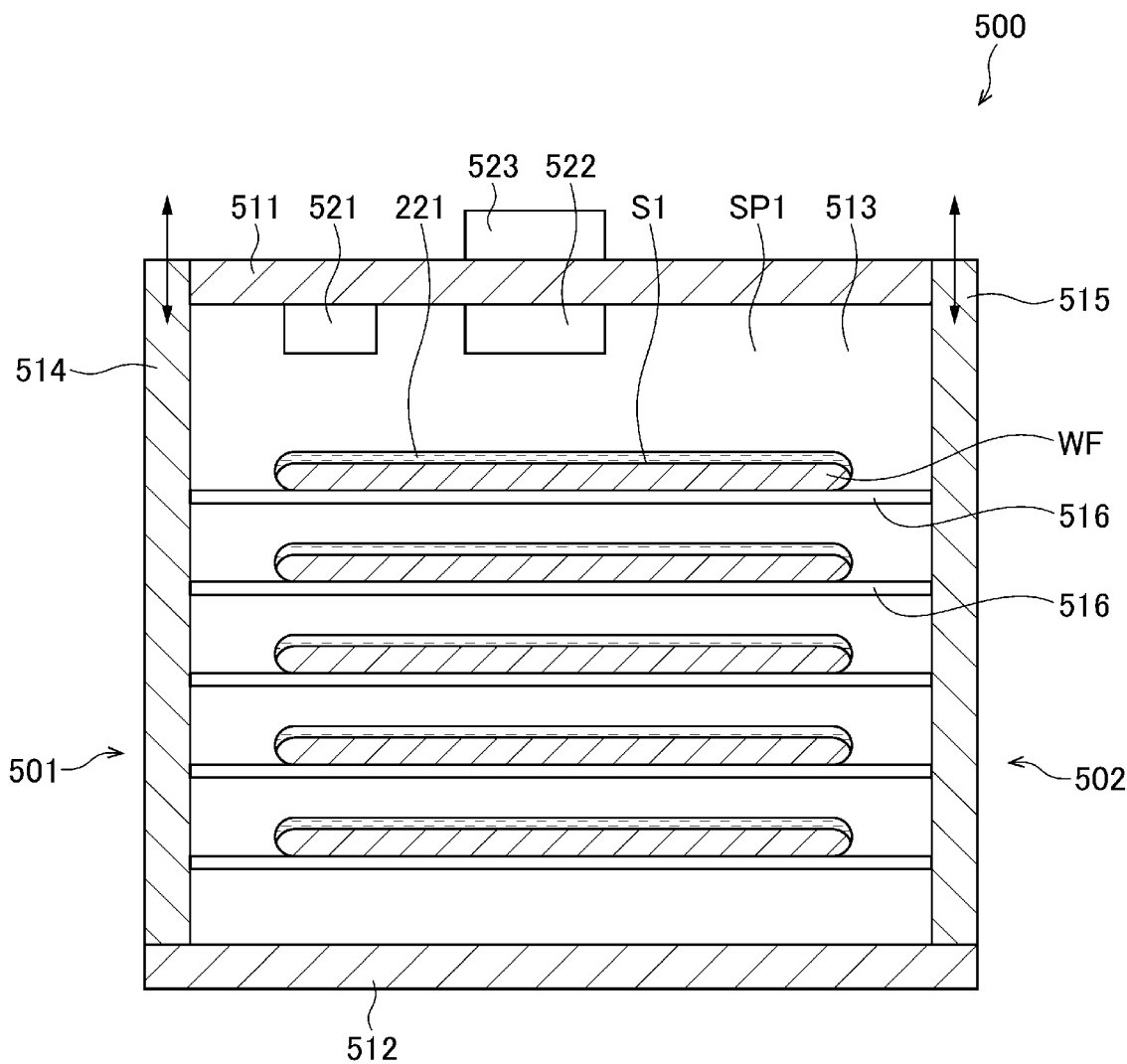
FIG. 12 depicts a holding unit according to an embodiment.

The top plate 511, the bottom plate 512, and the pair of side plates 513 are arranged to be cylindrical as a whole, and openings are formed on both left and right sides in FIG. 12. The opening formed on the left side of FIG. 12 serves as an inlet 501 through which the substrates WF are conveyed into the holding unit 500. The opening formed on the right side of FIG. 12 serves as an outlet 502 through which the substrates WF are removed from the inside of the holding unit 500. In a regular state, the inlet 501 is closed by the inlet shutter 514, and the outlet 502 is closed by the outlet shutter 515. The inlet shutter 514 and the outlet shutter 515 both are substantially rectangular plate-shaped members and can be slid in the vertical direction by a driving mechanism. The operations of the inlet shutter 514 and the outlet shutter 515 can be individually controlled by a control device 523.

Figure 13:
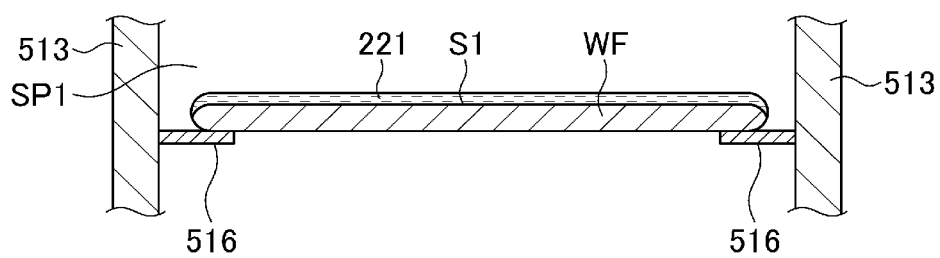
FIG. 13 depicts a holding unit according to an embodiment.

A plurality of support protrusions 516 are provided on the inner surfaces of the side plates 513 extending in the horizontal direction and facing each other in the vertical direction. As shown in FIG. 13, the support protrusions 516 protrude inward from the respective side plates 513. The support protrusions 516 support the substrates WF from below. The interval between the support protrusions 516 adjacent to each other in the vertical direction is the same as the interval between the horizontal arms 420 adjacent to each other in the same direction.

The plurality of substrates WF are simultaneously conveyed into a space SP1 formed inside the holding unit 500 by the conveyance member 400. In this process, the inlet shutter 514 slides upward to open the inlet 501. Subsequently, the conveyance member 400 holding the substrates WF (as in FIG. 10) is inserted into the space SP1 through the inlet 501, and the substrates WF are disposed on the respective support protrusions 516. Thereafter, the conveyance member 400 moves to the outside, and the inlet 501 is closed by the inlet shutter 514. The substrates WF may be carried in by the conveyance member 400 all at one time or may be carried in by the conveyance member 400 at different times.

When a substrate WF is being taken out from the holding unit 500 by the single-substrate type conveyance unit 15, the outlet shutter 515 slides upward to open the outlet 502. When the taking-out of the substrate WF is completed, the outlet shutter 515 slides downward to close the outlet 502. In the present embodiment, the substrates WF are removed from the holding unit 500 one by one, and thus, the outlet shutter 515 is opened and closed as described above for each removal.

Figure 14:
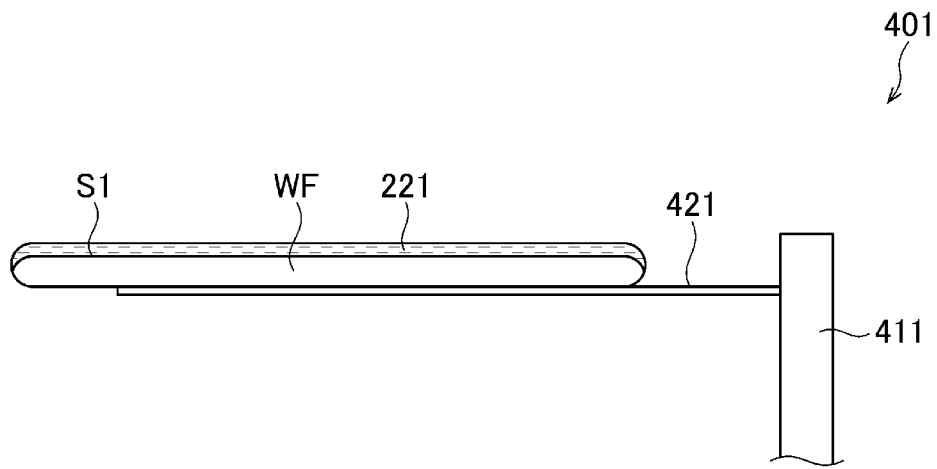
FIG. 14 depicts a single-substrate type conveyance unit according to an embodiment.

The single-substrate type conveyance unit 15 is provided with a conveyance member 401 shown in FIG. 14. The conveyance member 401 includes a vertical shaft 411 and a horizontal arm 421. The vertical shaft 411 is a rod-shaped member. The vertical shaft 411 can be moved up and down by a driving mechanism. The horizontal arm 421 is a plate-shaped member connected to the vertical shaft 410. In this example, only one horizontal arm 421 is provided in the conveyance member 401. The shape of the horizontal arm 421 can be the same or substantially the same as the shape of the horizontal arm 420 of the conveyance member 400 shown in FIG. 11.

When the substrates WF are being taken out from the holding unit 500 by the conveyance member 401 the outlet shutter 515 of the holding unit 500 slides upward to open the outlet 502 to permit the conveyance member 401 to be inserted into the space SP1 through the outlet 502. One substrate WF is pulled up from its respective support protrusion 516 by the horizontal arm 421. After the conveyance member 401 moves to the outside of the holding unit 500, the outlet 502 is closed by the outlet shutter 515.

In the present embodiment, the drying unit 16 dries the substrates WF one by one by a method called "supercritical drying" (SCD). In this supercritical drying process, the rinse liquid 221 that remains on the surface S1 of the substrate WF is replaced with a water-soluble organic solvent, such as isopropyl alcohol (IPA), and then this water-soluble organic solvent is heated to a supercritical state. The replacement of the rinse liquid 221 with IPA is performed by, for example, immersing the substrate WF in IPA stored in a tank or the like, but other known methods may be used.

Figure 15:
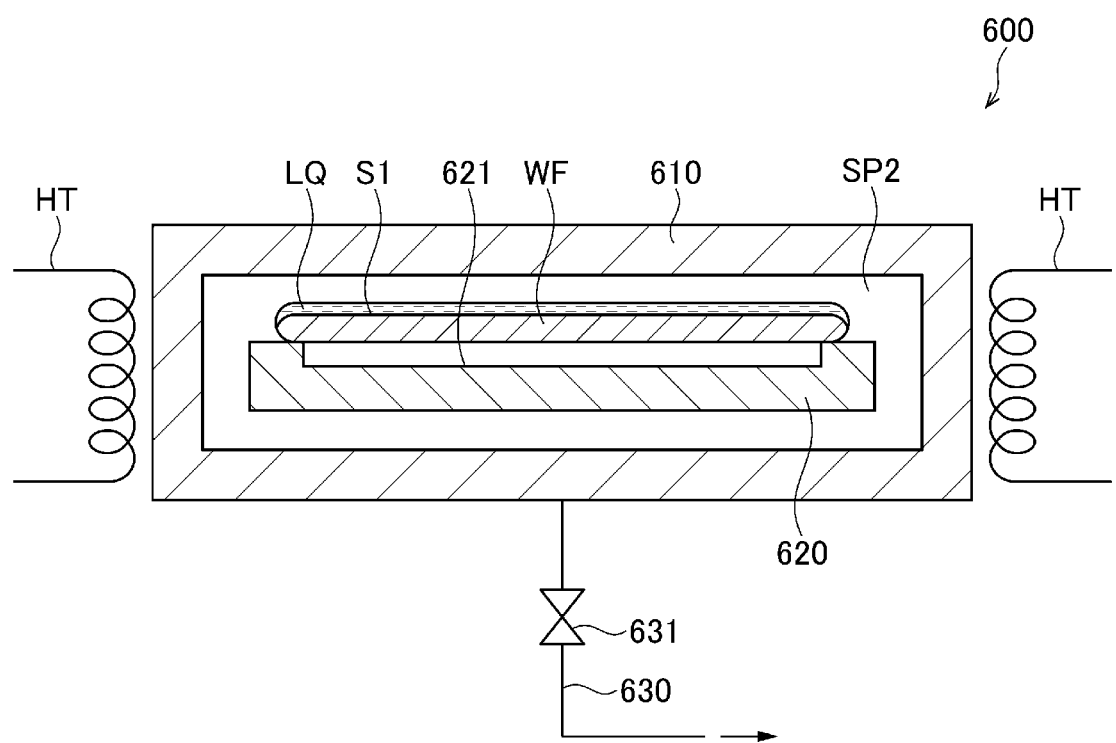
FIG. 15 depicts a supercritical device according to an embodiment.

Thereafter, the substrate WF is conveyed to a supercritical device 600 shown in FIG. 15 by the conveyance member 401 in a state in which the entire surface S1 of the substrate WF is wet with IPA. The supercritical device 600 performs the supercritical drying process on the substrate WF by bringing the IPA on the surface S1 into the supercritical state.

As depicted in FIG. 15, the supercritical device 600 includes a chamber 610, a stage 620, a heater HT, and a pipe 630.

The chamber 610 is a container that accommodates therein the substrate WF to be dried. A space SP2 is formed inside the chamber 610. Since the inside of the space SP2 becomes high pressure when supercritical drying is performed, the chamber 610 is a high-pressure container formed of, for example, stainless steel (SUS) or the like.

The stage 620 is a table or platform on which the substrate WF can be placed. A recess 621 is formed in an upper surface portion of the stage 620. The substrate WF can placed onto the stage 620 from above onto a ring-shaped portion of the stage 620 that is formed surrounding the recess 621. As shown in FIG. 15, the substrate WF is placed on the stage 620 with the surface S1 facing upward. In FIG. 15, a reference symbol "LQ" indicates the IPA (or other water-soluble organic solvent) liquid covering the surface S1.

The heater HT is an electric heater that heats the chamber 610. When the heater HT is energized, the heater HT generates heat, and the temperature of the chamber 610 and the temperature of the space SP2 rise. The heater HT may be disposed outside the chamber 610 or may be embedded in a wall of the chamber 610.

The pipe 630 discharges gas from inside the chamber 610 to the outside. The pipe 630 is has a control valve 631 in the flow path thereof. When the supercritical drying is performed, the control valve 631 is adjusted by a control device so the pressure in the space SP2 can be adjusted/regulated.

When a substrate WF to be dried is placed on the upper surface of the stage 620, a shutter or the like closes to seal the space SP2. Thereafter, the chamber 610 is heated by the heater HT. As the IPA is heated and a part of the IPA vaporizes, and the pressure in the space SP2 increases. When the pressure reaches the critical pressure of the IPA and the temperature of the IPA rises to at least the critical temperature, the space SP2 is filled with the IPA in the supercritical state. At this time, the surface S1 of the substrate WF is covered with IPA in the supercritical state.

Thereafter, the control valve 631 is opened, and the supercritical IPA is discharged from the space SP2. On the surface S1 of the substrate WF, since the IPA is removed while in the supercritical state without returning to the liquid, surface tension does not act on the insulating layers 810, and collapse of the pattern due to drying, such as shown in FIG. 3B, does not occur.

In other examples, the supercritical device 600 may have a configuration in which a supercritical fluid is supplied to fill the space SP2 via the pipe 630 or the like. The configuration of the supercritical device 600 is not particularly limited so long as supercritical drying process can be performed on the substrate WF. Likewise, the supercritical fluid is not limited to IPA. For example, carbon dioxide, water, hydrocarbons, perfluorocarbons, or the like can be used as the supercritical fluid.

When the supercritical drying process is completed, the substrate WF is taken out from the supercritical device 600 by the conveyance member 401 and conveyed to the load port 17.

In the present embodiment, from the holding unit 500 of the delivery unit 14, the substrates WF are taken out and conveyed to a drying unit 16 one by one by the single-substrate type conveyance unit 15. In such a configuration, after the cleaning of the plurality of substrates WF by the batch type cleaning unit 13 in the batch manner is completed, some of the cleaned substrates WF are made to stand by in the holding unit 500 for some time before the drying process can be performed, and such substrates WF may experience drying of the rinse liquid 221 with the lapse of time and hence collapse of the pattern due to the surface tension.

To prevent such drying during the wait time for the next process, the holding unit 500 of the substrate processing apparatus 10 according to the present embodiment can be provided with a vapor pressure adjusting device 522 such as shown in FIG. 12.

As shown in FIG. 12, the holding unit 500 is provided with a vapor pressure sensor 521, the vapor pressure adjusting device 522, and the control device 523. The vapor pressure sensor 521 measures the vapor pressure in the space SP1. The vapor pressure measured by the vapor pressure sensor 521 can be the partial pressure of the rinse liquid 221 on the surface S1 of the substrate WF. If the rinse liquid 221 is pure water, as in the present embodiment, a humidity sensor may be used as the vapor pressure sensor 521. The value measured by the vapor pressure sensor 521 is conveyed to the control device 523 for controlling of the pressure adjusting device 522.

The vapor pressure adjusting device 522 regulates the pressure (vapor pressure) in the space SP1. The pressure adjusted by the vapor pressure adjusting device 522 corresponds to the pressure (or vapor pressure) measured by the vapor pressure sensor 521. For example, to adjust the vapor pressure, the vapor pressure adjusting device 522 can increase the vapor pressure in the space SP1 by spraying the rinse liquid 221 as a mist or the like into the space SP1. The operation of the vapor pressure adjusting device 522 is controlled by the control device 523.

The control device 523 includes, for example, a microcomputer and integrally controls the operation of the holding unit 500. For example, the control device 523 controls the inlet shutter 514 and the outlet shutter 515. The control device 523 may also control the vapor pressure adjusting device 522 based on the vapor pressure measured by the vapor pressure sensor 521.

Figure 16:
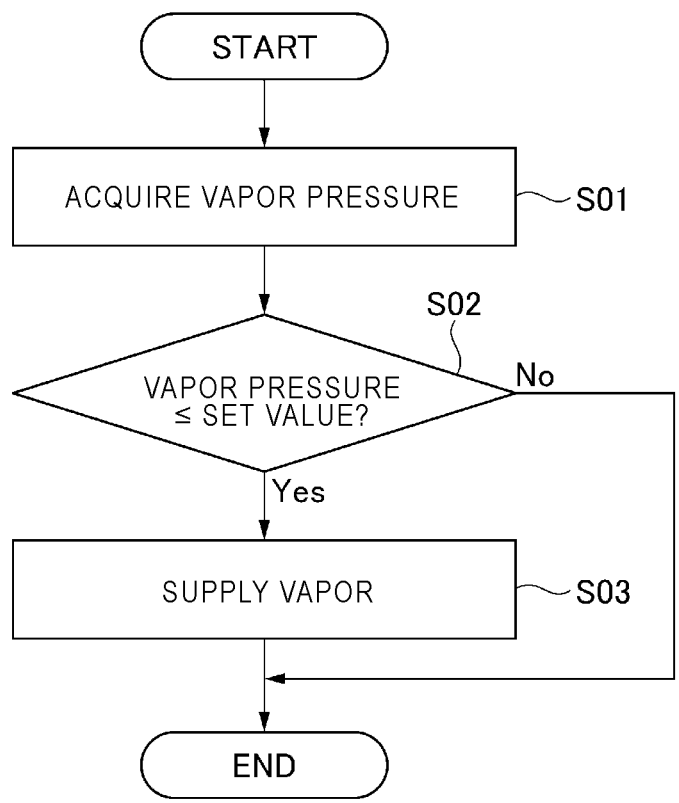
FIG. 16 is a flowchart of processes executed by a control device of a holding unit according to an embodiment.

A flow of processes executed by control device 523 will be described with reference to FIG. 16. The series of the processes can be repeatedly executed every time a predetermined control period elapses while the substrates WF are being held in the holding unit 500.

In step S01, the control device 523 acquires the value of the vapor pressure as measured by the vapor pressure sensor 521. In step S02, the control device 523 determines whether the acquired value of the vapor pressure is equal to or less than a set value. The set value is, for example, slightly higher than a target pressure set for the vapor pressure within the space SP1. If the acquired vapor pressure value exceeds the set value (No in S02), the series of the processes ends. If the acquired vapor pressure value is equal to or less than the set value (Yes in S02), the process proceeds to step S03.

In step S03, the control device controls the vapor pressure adjusting device 522 to increase the vapor pressure in the space SP1, for example, by introducing additional vapor, mist, or the like into the space SP1. By operation of the vapor pressure adjusting device, the vapor pressure in the space SP1 increases to the above set value or more.

By repeatedly executing this series of processes, the vapor pressure of the rinse liquid 221 around the substrates WF can be maintained at or above the target pressure. In the present embodiment, the target pressure is set in advance as a lower limit vapor pressure for maintaining the state where the entire or substantially entire surface S1 of each of the substrates WF is wet with the rinse liquid 221 during the period in which the substrates WF are being held in the holding unit 500. With the vapor pressure of the rinse liquid at or above the threshold value, the rinse liquid 221 cannot substantially dry from the surface S1 during the stand-by period before the substrates WF are taken out from the holding unit 500 for the next process.

In the present embodiment, the vapor pressure sensor 521, the vapor pressure adjusting device 522, and the control device 523 together constitute a vapor maintenance mechanism that is capable of keeping the surface S1 of each of the substrates WF wet with the rinse liquid 221 while being held in the holding unit 500. The maintenance mechanism can be configured to supply a liquid or a gas having the same component as the liquid covering the surface S1 to the surface S1 of each substrate WF.

Figure 17:
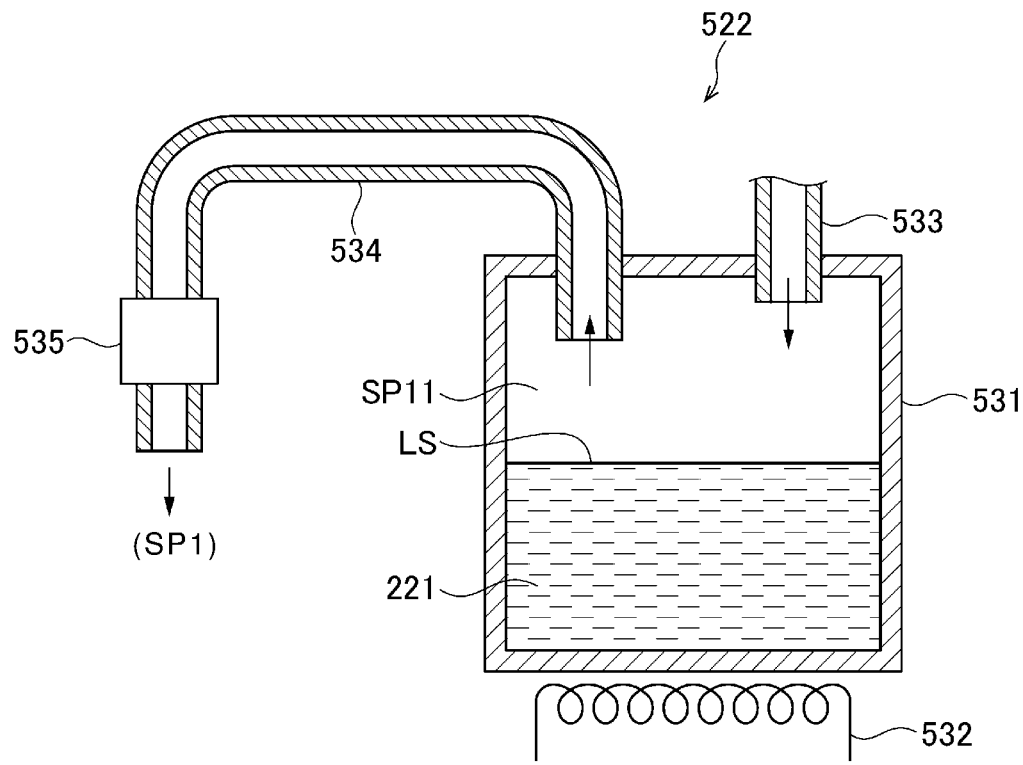
FIG. 17 depicts a vapor pressure adjusting device according to an embodiment.

As the vapor pressure adjusting device 522 of a vapor maintenance mechanism, devices of various configurations or forms may be used. For example, as shown in FIG. 17, the vapor pressure adjusting device 522 includes a tank 531, a heater 532, a pressurizing pipe 533, and a supply pipe 534.

The tank 531 is a sealed container. In a space SP11 inside the tank 531, the rinse liquid 221 is stored in a liquid state.

The heater 532 is an electric heater that heats the rinse liquid 221 to generate vapor of the rinse liquid 221 in the space SP11. An operation of the heater 532 is controlled by the control device 523.

The pressurizing pipe 533 introduces a gas (for example, air) into the space SP11 by a pump to feed the vapor from the space SP11 to the supply pipe 534. One end portion of the pressurizing pipe 533 is open above a liquid surface LS of the rinse liquid 221. As the gas fed from the pressurizing pipe 533, any gas may be used as long as the gas does not adversely react with the rinse liquid 221, a film on the substrate WF, or the like. An operation of a vapor pump for feeding the pressure-feeding gas is controlled by the control device 523.

The supply pipe 534 feeds the vapor of the rinse liquid 221 generated in the space SP11 to the space SP1 of the holding unit 500. The supply pipe 534 with a valve 535, and the valve 535 is controlled by the control device 523. An upstream end portion of the supply pipe 534 is above the liquid surface LS of the rinse liquid 221.

When the heater 532 is turned on, the control device 523 opens the valve 535 and feeds the gas from the pressurizing pipe 533. This operation causes the rinse liquid 221 in the form of a mist or gas to be supplied to the space SP1 of the holding unit 500, and consequently, drying of the rinse liquid 221 on the surface S1 is prevented.

In another embodiment, an ultrasonic generator may be used instead of the heater 532. The control device 523 can generate a mist of the rinse liquid 221 in the space SP11 by operating the ultrasonic generator. By opening the valve 535 at the same time as feeding the gas from the pressurizing pipe 533, the rinse liquid 221 in the form of a mist can be supplied to the space SP1 of the holding unit 500.

In still another embodiment, as the vapor pressure adjusting device 522 of the vapor maintenance mechanism of the holding unit 500, a mechanism in a mode different from that in the present embodiment may be used so long as the surface S1 of each of the substrates WF held by the holding unit 500 can be kept wet with the rinse liquid 221. For example, a device, a mechanism, or the like that periodically supplies the rinse liquid 221 as a liquid onto to the surface S1 of the substrate WF may be used as the vapor pressure adjusting device 522.

Figure 18:
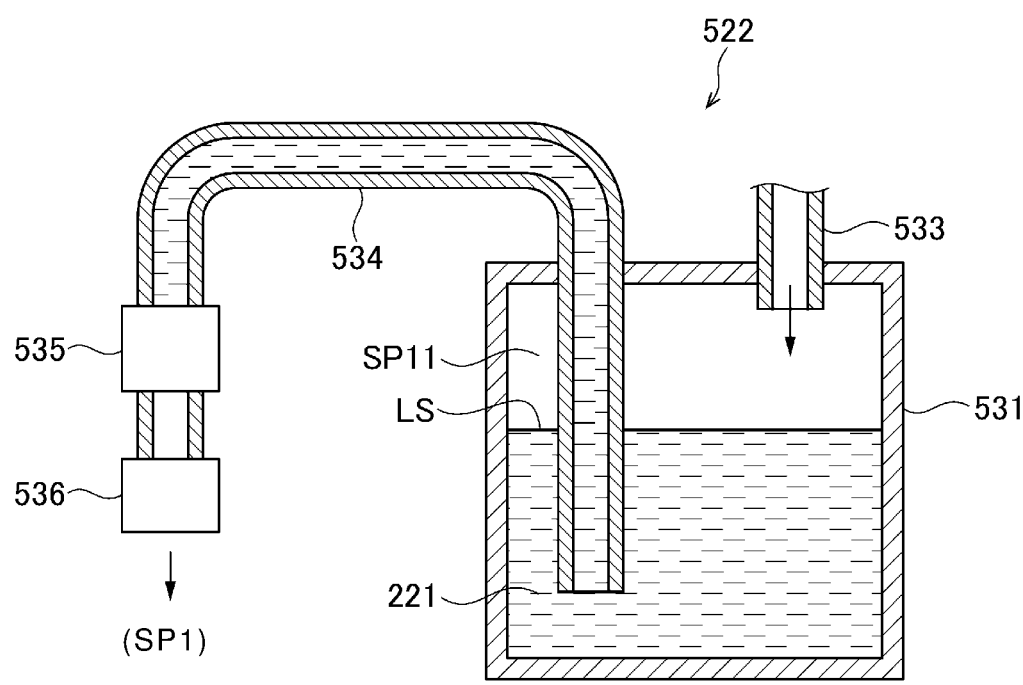
FIG. 18 depicts another vapor pressure adjusting device according to an embodiment.

As a configuration of a vapor pressure adjusting device 522, the configuration shown in FIG. 18 may be adopted. In FIG. 18, the upstream side end portion of the supply pipe 534 is below the liquid surface LS of the rinse liquid 221. A spray nozzle 536 is provided at a downstream end portion of the supply pipe 534. In this example, the heater 532 is not provided.

With such a configuration, the control device 523 causes the valve 535 to be in the open state while the gas for pressure feeding is being fed from the pressurizing pipe 533. In this example, the rinse liquid 221 is fed into the supply pipe 534 in the liquid form rather than vapor form. The liquid (rinse liquid 221) is then sprayed or dispensed from the spray nozzle 536 into the space SP1 of the holding unit 500. A plurality of spray nozzles 536 may be provided to spray the rinse liquid 221 toward each of the substrates WF. Alternatively, a shower head may be provided instead of the spray nozzle 536.

In one embodiment, the vapor pressure adjusting device 522 shown in FIG. 17 or FIG. 18 may be disposed inside the holding unit 500. In another embodiment, some or all of the elements and configuration of a vapor pressure adjusting device 522 may be disposed outside the holding unit 500.

A substrate processing method that is executed by the substrate processing apparatus 10 according to the present embodiment includes cleaning the plurality of substrates WF simultaneously in the batch type cleaning unit 13, holding all of these the cleaned substrates WF inside the holding unit 500 while keeping the surface S1 of each of the cleaned substrates WF wet with liquid (e.g., the rinse liquid 221), taking out substrates WF one by one from the holding unit 500, and then individually drying each of the substrates WF in a drying unit 16. In order to maintain the state where the surface S1 is kept wet with the liquid, a vapor maintenance mechanism maintains the vapor pressure inside the holding unit 500 at or above a target pressure. By performing the cleaning and drying processing of each substrate WF by the substrate processing method according to the present embodiment, it is possible to prevent pattern collapse or other defects that might otherwise be caused due to rinse liquid drying while still performing the cleaning processing of the plurality of substrates WF in a relatively short period of time.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A substrate processing apparatus, comprising:
   a batch cleaning unit configured to simultaneously clean a plurality of substrates in a batch process with a first liquid;
   a holding unit configured to receive the plurality of substrates from the batch cleaning unit while still wet with the first liquid and then store the plurality of substrates in a space inside the holding unit while still wet with the first liquid;
   a single-substrate drying unit configured to receive substrates one by one from the holding unit and then dry the substrates one by one; and
   a conveyance unit between the holding unit and the single-substrate drying unit, the conveyance unit configured to take out one of the substrates at a time from the holding unit and convey the taken out substrate to the single-substrate drying unit, wherein
   the holding unit includes a maintenance mechanism configured to keep a first surface of each of the substrates being stored in the holding unit covered with the first liquid, and
   the maintenance mechanism comprises a vapor pressure adjusting device configured to adjust a vapor pressure of the first liquid in the space.

2. The substrate processing apparatus according to claim 1, wherein the maintenance mechanism maintains the vapor pressure of the first liquid in the space to be a target pressure or higher.

3. The substrate processing apparatus according to claim 1, wherein the maintenance mechanism further comprises:
   a vapor pressure sensor configured to measure the vapor pressure in the holding unit; and
   a control device configured to control the vapor pressure adjusting device based on a value of the vapor pressure measured by the vapor pressure sensor.

4. The substrate processing apparatus according to claim 1, wherein the vapor pressure adjusting device is further configured to supply a liquid to the holding unit.

5. The substrate processing apparatus according to claim 2, wherein the vapor pressure adjusting device comprises an ultrasonic generator.

6. The substrate processing apparatus according to claim 1, further comprising:
   a delivery unit between the batch cleaning unit and the holding unit, the delivery unit configured to:
     deliver the substrates from the batch cleaning unit to the holding unit, and
     keep at least the first surface of each of the substrates wet with the first liquid during the delivery.

7. The substrate processing apparatus according to claim 1, further comprising:
   a plurality of single-substrate drying units.

8. The substrate processing apparatus according to claim 1, wherein the batch cleaning unit includes:
   a cleaning tank including a cleaning liquid, and
   a rinsing tank including the first liquid.

9. The substrate processing apparatus according to claim 1, wherein the single-substrate drying unit is a supercritical drying device.

10. The substrate processing apparatus according to claim 1, wherein the vapor pressure includes the partial pressure of the first liquid on the surface of the plurality of substrates.

11. The substrate processing apparatus according to claim 10, wherein the first liquid is a rinse liquid.

12. The substrate processing apparatus according to claim 1, wherein the holding unit further includes a plurality of support protrusions configured to support substrates adjacent to each other in a vertical direction.

13. The substrate processing apparatus according to claim 1, wherein the plurality of substrates are simultaneously conveyed into the space inside the holding unit.

14. The substrate processing apparatus according to claim 1, wherein the holding unit further comprising:
   a pair of side plates facing each other, and
   a plurality of support protrusions on the inner wall of the side plates, the plurality of support protrusions configured to support the substrates.

15. The substrate processing apparatus according to claim 1, wherein the vapor pressure adjusting device is further configured to increase the vapor pressure in the space by spraying the first liquid as a mist.

16. The substrate processing apparatus according to claim 15, wherein the vapor pressure adjusting device further comprising:
   a tank configured to store the first liquid in the liquid state,
   a heater configured to heat the first liquid in the tank, and
   a supplying pipe configured to supply the vapor of the first liquid to the space.

17. A substrate processing apparatus, comprising:
   a batch cleaning unit configured to simultaneously clean a plurality of substrates in a batch process with a first liquid;
   a holding unit configured to receive the plurality of substrates from the batch cleaning unit while still wet with the first liquid and then store the plurality of substrates while still wet with the first liquid; and
   a single-substrate drying unit configured to receive substrates one by one from the holding unit and then dry the substrates one by one, wherein
   the holding unit includes a maintenance mechanism configured to keep a first surface of each of the substrates being stored in the holding unit covered with the first liquid,
   the maintenance mechanism comprises a vapor pressure adjusting device configured to adjust a vapor pressure of the first liquid in the holding unit, and
   the vapor pressure adjusting device comprises an ultrasonic generator.

18. The substrate processing apparatus according to claim 17, wherein the maintenance mechanism further comprises:
   a vapor pressure sensor configured to measure the vapor pressure in the holding unit; and
   a control device configured to control the vapor pressure adjusting device based on a value of the vapor pressure measured by the vapor pressure sensor.

19. The substrate processing apparatus according to claim 17, wherein the vapor pressure adjusting device is further configured to supply a liquid to the holding unit.

20. The substrate processing apparatus according to claim 17, further comprising:
   a delivery unit configured to:
      deliver the substrates from the batch cleaning unit to the holding unit, and
      keep at least the first surface of each of the substrates wet with the first liquid during the delivery.

21. The substrate processing apparatus according to claim 17, further comprising:
   a plurality of single-substrate drying units.

22. The substrate processing apparatus according to claim 17, wherein the batch cleaning unit includes:
   a cleaning tank including a cleaning liquid, and
   a rinsing tank including the first liquid.

23. The substrate processing apparatus according to claim 17, wherein the single-substrate drying unit is a supercritical drying device.

24. The substrate processing apparatus according to claim 17, wherein the maintenance mechanism maintains the vapor pressure of the first liquid in the holding unit to be a target pressure or higher.

* * * * *